US012619108B2

(12) United States Patent
Oron et al.

(10) Patent No.: US 12,619,108 B2
(45) Date of Patent: May 5, 2026

(54) HIGH BANDWIDTH TRAVELLING WAVE ELECTRO ABSORPTION MODULATOR (EAM) CHIP

(71) Applicant: Mellanox Technologies, Ltd., Yokneam (IL)

(72) Inventors: Moshe B. Oron, Yokneam (IL); Elad Mentovich, Yokneam (IL); Tali Septon, Yokneam (IL); Oren Steinberg, Yokneam (IL); Isabelle Cestier, Yokneam (IL)

(73) Assignee: Mellanox Technologies, Ltd., Yokneam (IL)

( * ) Notice: Subject to any disclaimer, the term of this patent is extended or adjusted under 35 U.S.C. 154(b) by 862 days.

(21) Appl. No.: 17/810,068

(22) Filed: Jun. 30, 2022

(65) Prior Publication Data

US 2023/0221588 A1 Jul. 13, 2023

Related U.S. Application Data

(60) Provisional application No. 63/266,527, filed on Jan. 7, 2022.

(51) Int. Cl.
G02F 1/017 (2006.01)
G02F 1/015 (2006.01)
(Continued)

(52) U.S. Cl.
CPC ........ G02F 1/01708 (2013.01); G02F 1/0158 (2021.01); G02F 1/0159 (2021.01);
(Continued)

(58) Field of Classification Search
CPC ........ G02F 1/212; G02F 1/025; G02F 1/0155; G02F 1/017; G02F 1/015; G02F 1/225;
(Continued)

(56) References Cited

U.S. PATENT DOCUMENTS 6,345,131 B1    2/2002  Jang
6,597,011 B1 *  7/2003  Atanackovic .......... H10F 30/21
                                                   257/17
(Continued)

FOREIGN PATENT DOCUMENTS

CN        108563041 A    9/2018
EP          3462232 B1    9/2017
(Continued)

OTHER PUBLICATIONS

Ackermann, M. et al., "Sub-wavelength tunneling barrier in rib waveguide microring modulators with vanishing pending losses," Opt. Lett. 47, 2626-2629 (2022).
(Continued)

*Primary Examiner* — Jie Lei
(74) *Attorney, Agent, or Firm* — Moore & Van Allen PLLC; Michele M. Glessner

(57)                ABSTRACT

High bandwidth (e.g., >100 GHz) modulators and methods of fabricating such are provided. An EAM comprises a waveguide mesa comprising a continuous multi-quantum well (MQW) layer; a plurality of electrode segments disposed on the waveguide mesa; and a microstrip transmission line disposed on an insulating material layer and in electrical communication with the plurality of electrode segments via conducting bridges. The waveguide mesa comprises alternating active sections and passive sections. An electrode segment of the plurality of electrodes is disposed on a respective one of the active sections. Portions of the continuous MQW layer disposed in each of the active sections having an energy gap defining an active energy gap value. Portions of the continuous MQW layer disposed in each of the passive sections having an energy gap defining an passive energy gap value. The active energy gap value is less than the passive energy gap value.

20 Claims, 8 Drawing Sheets

(51) Int. Cl.

| | |
|---|---|
| *H01S 5/026* | (2006.01) |
| *H01S 5/06* | (2006.01) |
| *H01S 5/22* | (2006.01) |
| *H01S 5/34* | (2006.01) |

(52) U.S. Cl.
CPC .......... *H01S 5/0265* (2013.01); *H01S 5/0601*
(2013.01); *H01S 5/22* (2013.01); *G02F*
*2202/06* (2013.01); *G02F 2202/102* (2013.01);
*G02F 2202/108* (2013.01); *H01S 5/34*
(2013.01); *H01S 2304/00* (2013.01)

(58) Field of Classification Search
CPC ...... G02F 1/035; G02F 1/0311; G02F 1/0316;
G02F 1/01708; G02F 1/0158; G02F
1/2257; G02F 1/0356; G02F 1/0159;
G02F 1/0157; G02F 2202/06; G02F
2202/102; G02F 2202/108; G02B 6/42;
G02B 6/4206; G02B 6/29355; G02B
6/10; G02B 6/136; G02B 6/132; G02B
6/1345; H01S 5/026; H01S 5/0265; H01S
5/22; H01S 5/0601; H01S 5/34; H01S
2304/00
USPC .............. 359/237, 345, 348, 340, 279, 315;
385/2–4, 14, 20, 24, 32, 129, 131
See application file for complete search history.

(56) References Cited

U.S. PATENT DOCUMENTS

| | | | |
|---|---|---|---|
| 6,914,706 | B2 | 7/2005 | Ishimura |
| 7,010,179 | B2 | 3/2006 | Hatta et al. |
| 7,409,123 | B1 | 8/2008 | Feng et al. |
| 7,542,641 | B1 | 6/2009 | Asghari et al. |
| 7,658,552 | B2 | 2/2010 | Asghari |
| 7,917,035 | B2 | 3/2011 | Asghari et al. |
| 8,090,231 | B1 | 1/2012 | Asghari et al. |
| 8,160,404 | B2 | 4/2012 | Pan |
| 8,242,432 | B2 | 8/2012 | Feng et al. |
| 8,346,028 | B2 | 1/2013 | Feng et al. |
| 8,411,260 | B1 | 4/2013 | Feng et al. |
| 8,463,088 | B1 | 6/2013 | Asghari et al. |
| 8,476,576 | B2 | 7/2013 | Dong et al. |
| 8,526,769 | B1 | 9/2013 | Feng et al. |
| 8,638,485 | B2 | 1/2014 | Feng et al. |
| 8,724,100 | B1 | 5/2014 | Asghari et al. |
| 8,728,837 | B2 | 5/2014 | Fong et al. |
| 8,737,772 | B2 | 5/2014 | Dong et al. |
| 8,817,354 | B2 | 8/2014 | Feng et al. |
| 8,897,606 | B2 | 11/2014 | Asghari et al. |
| 8,965,208 | B2 | 2/2015 | Asghari |
| 8,989,522 | B2 | 3/2015 | Qian et al. |
| 9,025,241 | B2 | 5/2015 | Asghari et al. |
| 9,142,698 | B1 | 9/2015 | Cunningham |
| 9,217,831 | B1 | 12/2015 | Asghari |
| 9,217,836 | B2 | 12/2015 | Asghari et al. |
| 9,244,327 | B2 | 1/2016 | Prosyk |
| 9,274,353 | B1 | 3/2016 | Dong |
| 9,279,936 | B2 | 3/2016 | Qian et al. |
| 9,312,960 | B1 | 4/2016 | Feng et al. |
| 9,379,515 | B1 | 6/2016 | Asghari et al. |
| 9,588,294 | B2 | 3/2017 | Fong et al. |
| 9,702,278 | B2 | 7/2017 | Fathololoumi et al. |
| 9,798,166 | B1 | 10/2017 | Sharma |
| 9,952,456 | B2 | 4/2018 | Huang |
| 9,966,733 | B2 | 5/2018 | Feng et al. |
| 9,991,965 | B2 | 6/2018 | Christensen |
| 10,031,355 | B2 | 7/2018 | Feng et al. |
| 10,078,232 | B1 | 9/2018 | Vermeulen |
| 10,288,805 | B2 | 5/2019 | Luff et al. |
| 10,330,864 | B2 | 6/2019 | Asghari et al. |
| 10,394,060 | B2 | 8/2019 | Mentovich |
| 10,649,244 | B1 | 5/2020 | Mentovich et al. |
| 10,895,797 | B2 | 1/2021 | Cavaliere |
| 11,397,363 | B2 | 7/2022 | Kawakami |
| 2003/0147574 | A1 | 8/2003 | Lam et al. |
| 2007/0009195 | A1 | 1/2007 | Eriksson et al. |
| 2008/0170821 | A1 | 7/2008 | Kissa et al. |
| 2009/0297088 | A1 | 12/2009 | Koh |
| 2010/0330727 | A1 | 12/2010 | Hill |
| 2012/0251029 | A1 | 10/2012 | Kobrinsky |
| 2013/0182305 | A1 | 7/2013 | Feng |
| 2015/0010263 | A1 | 1/2015 | Fong |
| 2015/0055911 | A1 | 2/2015 | Bowers |
| 2016/0349541 | A1 | 12/2016 | Velthaus et al. |
| 2017/0269391 | A1 | 9/2017 | Feng |
| 2017/0351124 | A1 | 12/2017 | Roth |
| 2018/0129082 | A1 | 5/2018 | Lin et al. |
| 2018/0314128 | A1 | 11/2018 | Sun |
| 2019/0179177 | A1 | 6/2019 | Rickman |
| 2019/0187495 | A1 | 6/2019 | Melikyan et al. |
| 2019/0293971 | A1 | 9/2019 | Yu |
| 2020/0012043 | A1 | 1/2020 | Abediasl |
| 2020/0124878 | A1 | 4/2020 | Yu |
| 2021/0191164 | A1 | 6/2021 | Mentovich |
| 2021/0226409 | A1 | 7/2021 | Grillanda et al. |
| 2021/0336418 | A1 | 10/2021 | Lakovlev |
| 2022/0236619 | A1 | 7/2022 | Hoessbacher |
| 2022/0337321 | A1 | 10/2022 | Argyris |
| 2023/0018578 | A1 | 1/2023 | Bakopoulos |
| 2023/0127711 | A1 | 4/2023 | Maglio et al. |
| 2024/0027706 | A1 | 1/2024 | Tadayon et al. |
| 2024/0310662 | A1* | 9/2024 | Oron ...................... G02F 1/025 |

FOREIGN PATENT DOCUMENTS

| | | |
|---|---|---|
| WO | 2020149953 A1 | 7/2020 |
| WO | 2022200292 A1 | 9/2022 |

OTHER PUBLICATIONS

Akiyama, S. et al. "Cascaded-ring-resonator-loaded Mach-Zehnder modulator for enhanced modulation efficiency in wide optical bandwith," Opt. Expr. 20, 16321-16338 (2012).

Akiyama, Suguru et al. "InP-Based Mach-Zehnder Modulator With Capacitively Loaded Travelling-Wave Electrodes," Journal of Lightwave Technology, vol. 26, No. 5, Mar. 1, 2008, pp. 608-615, DOI: 10.1109/JLT.2007.915278.

Bin Wang et al. (2022), "Principles of Selective Area Epitaxy and Applications in III-V Semiconductor Lasers Using MOCVD: A Review," Crystals 2022, 12(7), 1011.

Cui, Yansong et al. "Modeling and Design of GaAs Traveling-Wave electrooptic Modulators Based On Capacitively Loaded Coplanar Strips," Journal of Lightwave Technology, vol. 24, No. 1, Jan. 2006, pp. 544-554, DOI: 10.1109/JLT.2005.859851.

D. A. B. Miller et al. (1984), "Band-Edge Electroabsorption in Quantum Well Structures: The Quantum-Confined Stark Effect," Phys. Rev. Lett. 53, 2173.

Han, C. et al., "Recent progress in silicon-based slow-light electrooptic modulators," Micromachines 13, 400 (2022).

Han, C. et al., "Ultra-compact silicon modulator with 110 GHz bandwith," in Proc. Opt. Fib. Comm. Conf. (OFC), (Optica Publishing Group, Washington, D.C. 2022), p. Th4C.5.

Horikawa, T. et al., "A 300-nm silicon photonics platform for large-scale device integration," J. Sel. Top. Quant. Electron, 24, 8200415 (2018).

Hou et al. (2010), "Monolithic 40 GHz passively Mode-locked AlGaInAs/InP 1.55 mm MQW Laser with Surface-etched Bragg Gratings," European Conference on Integrated Optics (ECIO 10).

J. Yan, T. Yeh, Y. Chang, Y. Wu, and K. Feng, "DSP Equalization-free Data Center Communication with High Dispersion Tolerant Optical Duobinary-PAM4 Signal," in Conference on Lasers and Electro-Optics, OSA Technical Digest (online) (Optical Society of America, 2017), paper SF1L.4.

Jafari, O. et al., "Mach-Zehnder silicon photonic modulator assisted by phase-shifted bragg gratings," Photon. Technol. Lett. 32, 445-448 (2020).

K. Yonenaga and S. Kuwano, "Dispersion-Tolerant Optical Trans-

(56)  References Cited

OTHER PUBLICATIONS mission System Using Duobinary Transmitter and Binary Receiver," IEEE J. Lightwave Technol., vol. 15, No. 8, pp. 1530-1537, 1997.

Klein, H.N. et al. "1.55µm Mach-Zehnder Modulators On InP For Optical 40/80 Gbit/s Transmission Networks," In 2006 International Conference on Indium Phosphide and Related Materials Conference Proceedings, May 8, 2006, pp. 171-173, IEEE.

Lange, Sophie et al. "100 GBd Intensity Modulation and Direct Detection With An InP-Based Monolithic DFB Laser Mach-Zehnder Modulator," Journal of Lightwave Technology, vol. 36, No. 1, Jan. 1, 2018, pp. 97-102.

Lange, Sophie et al. "Low Switching Voltage Mach-Zehnder Modulator Monolithically Integrated With DFB Laser For Data Transmission Up To 107.4 GB/s," Journal of Lightwave Technology, vol. 34, No. 2, Jan. 15, 2016, pp. 401-406, DOI: 10.1109/JLT.2015.2496426.

Margalit, N. et al., "Perspectives on the future of silicon photonics and electronics," Appl. Phys. Lett. 118, 220501 (2021).

Nakai, Y. et al. (2019), "Uncooled Operation of 53-GBd PAM4 (106-GB/s) EA/DFB Lasers With Extremely Low Drive Voltage With 0.9 Vpp," Journal of Lightwave Technology, vol. 37, Issue 7, pp. 1658-1662.

Nan Qi et al., Co-Design and Demonstration of a 25 Gbps Silicon-Photonic Mach Zehnder Modulator with a CMOS Based High Swing Driver, IEEE, Nov. 2016, pp. 1-11 (Year: 2016).

Ogiso, Yoshihiro et al. "Over 67 GHZ Bandwidth and 1.5 V Vp InP-Based Optical IQ Modulator With n-i-p-n Heterostructure," Journal of Lightwave Technology, vol. 35, No. 8, Apr. 15, 2017, pp. 1450-1455, DOI: 10.1109/JLT.2016.2639542.

Qian, Guang et al. "CL-TWE Mach-Zehnder Electro-Optic Modulator Based On InP-MQW Optical Waveguides," Chinese Optics Letters, vol. 17, No. 6, Jun. 2019, pp. 061301-1-061301-5, DOI: 10.3788/COL201917.061301.

Romero-Garcia, Sebastian et al., "High-speed resonantly enhanced silicon photonics modulator with a large operating temperature range", Optic Letters, vol. 42, Issue 1, pp. 81-84 (2017). https://doi.org/10.1364/OL.42.000081.

Sharif Azadeh, S. et al., "Low Vp silicon photonics modulators with highly linear epitaxially grown phase shifters," Opt. Expr. 23, 23526-23550 (2015).

Stepanenko, M. et al. "Optimization of RF Electrodes For Electro-Optic Modulator Based On Quantum-Confined Stark Effect," In Journal of Physics: Conference Series 2019, vol. 1145, No. 1:012028, pp. 1-6, IOP Publishing.

Stepanenko, Mikhail et al. "Multi-Parameter Optimization Of An InP Electro-Optic Modulator," Symmetry, vol. 12, Nov. 21, 2020, pp. 1-18, DOI: 10.3390/sym12111920.

Tamura, M. et al. (2003), "High-speed electroabsorption modulators using ruthenium-doped SI-InP: impact of interdiffusion-free burying technology on E/O modulation characteristics," International Conference on Indium Phosphide and Related Materials, 2003. pp. 491-494.

Terada, Y. et al., "Full C-band Si photonic crystal waveguide modulator," Opt. Lett. 42, 5110-5112 (2017).

U.S. Appl. No. 17/644,625, filed Dec. 16, 2021, entitled "High Bandwidth Optical Modulator".

U.S. Appl. No. 17/694,159, filed Mar. 14, 2022, entitled "Serial Data Conversion Redundacy Using Optical Modulators".

U.S. Appl. No. 17/993,296, filed Nov. 23, 2022, entitled "Traveling Wave Cascaded Micro Ring Modulators".

U.S. Appl. No. 18/110,206, filed Feb. 15, 2023, entitled "System For In-Band Spectral Cross-Talk Monitoring".

U.S. Appl. No. 18/120,719, filed Mar. 13, 2023, entitled "Differential Traveling Wave Electro-Absorption Modulator for High Bandwidth Operation".

U.S. Appl. No. 18/120,802, filed Mar. 13, 2023, entitled "Low Voltage Traveling Wave Electro-Absorption Modulator for High Bandwidth Operation".

U.S. Appl. No. 63/266,527, filed Jan. 7, 2022, entitled "High Bandwidth Travelling Wave Electro Absorption Modulator (EAM) Chip".

Velthaus, K.-O. et al. "High Performance InP-Based Mach-Zehnder Modulators For 10 to 100 GB/s Optical Fiber Transmission Systems," 23rd International Conference On Indium Phosphide and Related Materials—IPRM 2011, May 22-26, 2011, (4 pages), Berlin, Germany.

Wang, Gary et al. "Low Vp, High Bandwidth, Small Form Factor InP Modulator," in 2014 IEEE Avionics, Fiber-Optics and Photonics Technology Conference (AVFOP), Nov. 11, 2014, pp. 41-42, IEEE.

Witzens, J., "High-Speed silicon photonics modulators," Proc. IEEE 106, 2158-2182 (2017).

Yamazaki, Hiroshi et al. "IMDD Transmission At Net Data Rate of 333 Gb/s Using Over-100-GHz-Bandwidth Analog Multiplexer and Mach-Zehnder Modulator," Journal of Lightwave Technology, vol. 37, No. 8, Apr. 15, 2019, pp. 1772-1778, DOI: 10.1109/JLT.2019.2898675.

Islam et al., "Very low input voltage cascaded travelling wave electroabsorption modulator (CTWEAM) for more than 100 Gbps," Optics Communications, vol. 297, pp. 43-47 (Year: 2013).

Li et al., "GeSi modulator based on two-mode interference," Applied Optics, vol. 53, No. 2, pp. 221-225 (Year: 2014).

Li, G.L. et al. "Analysis of Segmented Traveling-Wave Optical Modulators," Journal of Lightwave Technology, vol. 22, No. 7, Jul. 2004, pp. 1789-1796. Available online: <URL: https://opg.optica.org/jlt/abstract.cfm?uri=jlt-22-7-1789>.

Chaciński, Marek et al. "Monolithically Integrated 100 GHz DFB-TWEAM," Journal of Lightwave Technology, vol. 27, No. 16, Aug. 15, 2009, pp. 3410-3415. Available online: <URL: https://opg.optica.org/jlt/abstract.cfm?uri=jlt-27-16-3410>.

Li, G.L. et al. "Numerical Modeling of Segmented Traveling-Wave Electroabsorption Modulators," 2004 IEEE MTT-S International Microwave Symposium Digest (IEEE Cat. No. 04CH37535), vol. 2, pp. 773-776, Jun. 6-11, 2004. DOI: 10.1109/MWSYM.2004.1339076.

Hasebe et al, "Push-pull driven electro-absorption modulator integrated with DFB laser using selectively doped lateral pin diode structure," IEEE International Semiconductor Laser Conference, pp. 54-55 (Year: 2014).

* cited by examiner

502 FORM WAVEGUIDE MESA

504 FORM ELECTRODE SEGMENTS

506 FORM TRANSMISSION LINE AND BRIDGES

602 PERFORM SELECTIVE ION IMPLANTATION PROCESS

604 PERFORM RAPID THERMAL ANNEALING PROCESS

702 FORM MASK

704 PERFORM EPITAXIAL GROWTH

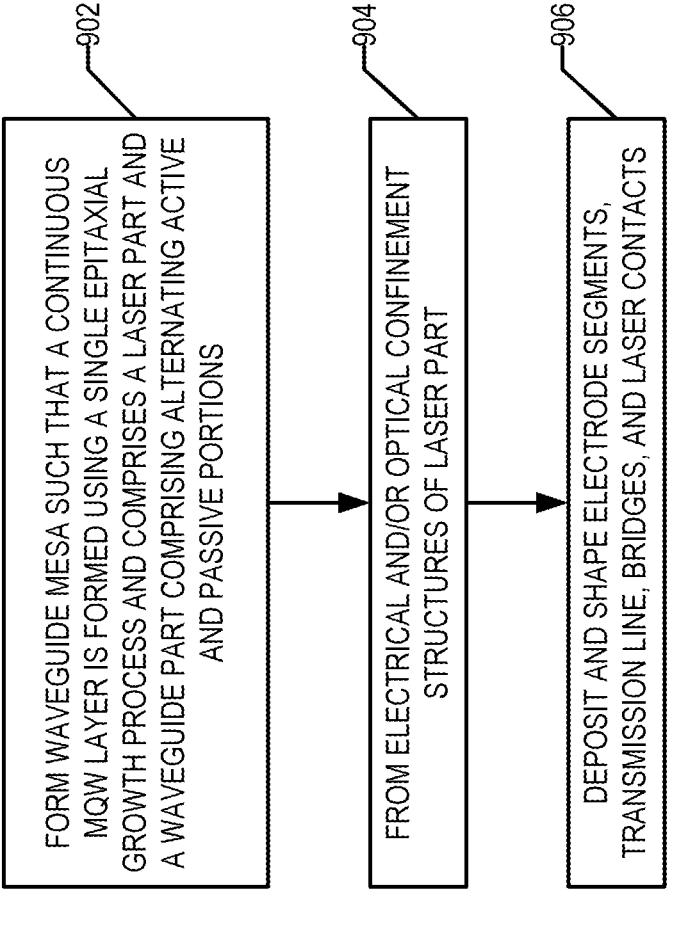

FORM WAVEGUIDE MESA SUCH THAT A CONTINUOUS MQW LAYER IS FORMED USING A SINGLE EPITAXIAL GROWTH PROCESS AND COMPRISES A LASER PART AND A WAVEGUIDE PART COMPRISING ALTERNATING ACTIVE AND PASSIVE PORTIONS
902

FROM ELECTRICAL AND/OR OPTICAL CONFINEMENT STRUCTURES OF LASER PART
904

DEPOSIT AND SHAPE ELECTRODE SEGMENTS, TRANSMISSION LINE, BRIDGES, AND LASER CONTACTS
906

FIG. 9

HIGH BANDWIDTH TRAVELLING WAVE ELECTRO ABSORPTION MODULATOR (EAM) CHIP

CROSS-REFERENCE TO RELATED APPLICATIONS

This application claims priority to U.S. Application No. 63/266,527, filed Jan. 7, 2022, the content of which is incorporated herein by reference in its entirety.

TECHNICAL FIELD

Embodiments relate to high bandwidth (e.g., bandwidth ≥100 GHz) electro-absorption modulators (EAMs) and methods of fabrication of high bandwidth EAMS.

BACKGROUND

As data communication demands increase in both volume and speed, fiber optics have become an increasingly popular communication medium. As a part of the utilization of fiber optics for communicating data, the communicated data stream may be generated by electro-optic modulators, such as Mach-Zehnder modulators (MZMs) and electro-absorption modulators (EAMs), that modulate an optical beam to encode data into the data stream. However, the 3 dB modulation bandwidth of conventional electro-absorption modulators is in the range of a gigahertz (GHz) to a few tens of GHz (~30 GHz). This is significantly less than the approximately 120 GHz bandwidth required by next generation optics-based telecommunications systems and next generation optical links.

BRIEF SUMMARY

Various embodiments provide electro-absorption modulators (EAMs) having high bandwidth. Various embodiments provide modulators having 3 dB modulation bandwidth of at least 100 GHz. Various embodiments provide methods for fabricating EAMs having 3 dB modulation bandwidth of at least 100 GHz. In various embodiments, the EAM is a traveling wave EAM comprising a waveguide mesa that includes a continuous multi-quantum well (MQW) layer and a travelling wave electrode (TWE) structure that includes a plurality of electrode segments disposed on the waveguide. The plurality of electrode segments cover no more than half of the surface of the waveguide mesa on which the electrode segments are disposed.

In an example embodiment, the continuous MQW layer of the waveguide mesa is formed to have different bandgap energies (e.g., the energy between the conduction band and the valence band within the MQW layer material) at different points along the continuous MQW layer. For example, sections of the MQW layer on which an electrode segment is disposed is referred to as an active section of the MQW layer and sections of the MQW layer on which an electrode segment is not disposed is referred to as a passive section. In an example embodiment, the bandgap energy in the active sections is less than the bandgap energy in the passive sections.

According to aspects of the present disclosure, a high bandwidth EAM device is provided. In an example embodiment, the EAM device includes a waveguide mesa including a continuous MQW layer and a segmented TWE structure. The TWE includes a plurality of electrode segments disposed on the waveguide mesa. The EAM device further comprises a microstrip transmission line disposed on an insulating material and in electrical communication with each of the plurality of electrode segments via conducting bridges. The waveguide mesa includes alternating active sections and passive sections. An electrode segment of the plurality of electrode segments is disposed on a respective one of the active sections. The portions of the MQW layer disposed in an active section have an energy gap (e.g., between the conduction band and the valence band of the MQW layer material) defining an active energy gap value. The portions of the MQW layer disposed in a passive section have an energy gap (e.g., between the conduction band and the valence band of the MQW layer material) defining a passive energy gap value. The active energy gap value is less than the passive energy gap value.

In an example embodiment, the EAM has a filling factor (FF) of less than 0.5, meaning that the plurality of electrode segments cover less than half of the surface of the waveguide mesa on which the plurality of electrode segments are disposed.

In an example embodiment, the continuous MQW layer is referred to as continuous because it is a continuous layer of material and does not include any butt joints along its length (in the direction of propagation of the EAM).

According to another aspect, an integrated EAM-laser device is provided. In an example embodiment, the integrated EAM-laser device comprises a semiconductor laser including a laser part of a continuous MQW layer, a waveguide mesa comprising a waveguide part of the continuous MQW layer, a segmented TWE structure including a plurality of electrode segments disposed on the waveguide mesa, and a microstrip transmission line disposed on an insulating material and in electrical communication with each of the plurality of electrode segments disposed on the waveguide mesa via conducting bridges. The waveguide mesa includes alternating active sections and passive sections. An electrode segment of the plurality of electrode segments is disposed on a respective one of the active sections. The portions of the MQW layer disposed in an active section have an energy gap (e.g., between the conduction band and the valence band of the MQW layer material) defining an active energy gap value. The portions of the MQW layer disposed in a passive section have an energy gap (e.g., between the conduction band and the valence band of the MQW layer material) defining a passive energy gap value. The active energy gap value is less than the passive energy gap value.

In an example embodiment, the laser part of the continuous MQW layer has an energy gap (e.g., between the conduction band and the valence band of the MQW layer material) defining a laser energy gap value and the laser energy gap value is less than the passive energy gap value According to still another aspect, a method for fabricating a high bandwidth EAM device is provided. In an example embodiment, the method comprises forming a continuous MQW layer of a waveguide mesa; and forming a plurality of electrode segments on the waveguide mesa. The waveguide mesa includes alternating active sections and passive sections. An electrode segment of the plurality of electrode segments is disposed on a respective one of the active sections. The portions of the MQW layer disposed in an active section have an energy gap (e.g., between the conduction band and the valence band of the MQW layer material) defining an active energy gap value. The portions of the MQW layer disposed in a passive section have an energy gap (e.g., between the conduction band and the valence band of the MQW layer material) defining a passive energy gap value. The active energy gap value is less than the passive energy gap value. The method further comprises forming a microstrip transmission line on an insulating material layer and in electrical communication with each of the plurality of electrode segments via conducting bridges.

In an example embodiment, forming the continuous MQW layer comprises a single epitaxial growth process, performing a quantum well intermixing process, and performing rapid thermal annealing process.

In an example embodiment, forming the continuous MQW layer comprises use of a selective area growth (SAG) method to form the continuous MQW layer using a single epitaxial growth process.

BRIEF DESCRIPTION OF THE DRAWING(S)

Having thus described the invention in general terms, reference will now be made to the accompanying drawings, which are not necessarily drawn to scale, and wherein:

Figure 2B:
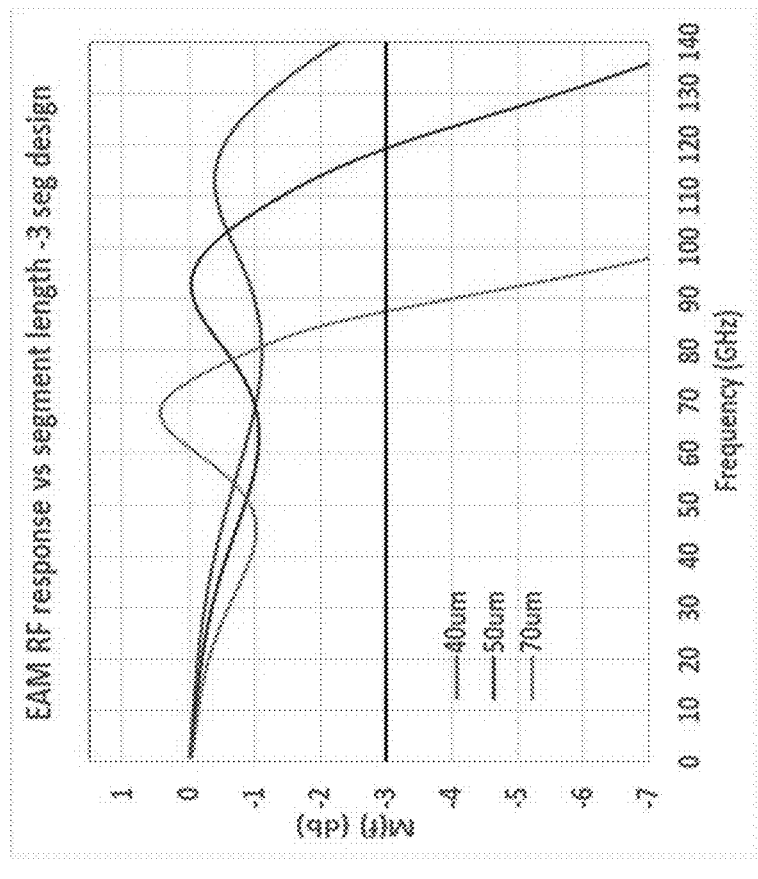
Figure 2A:
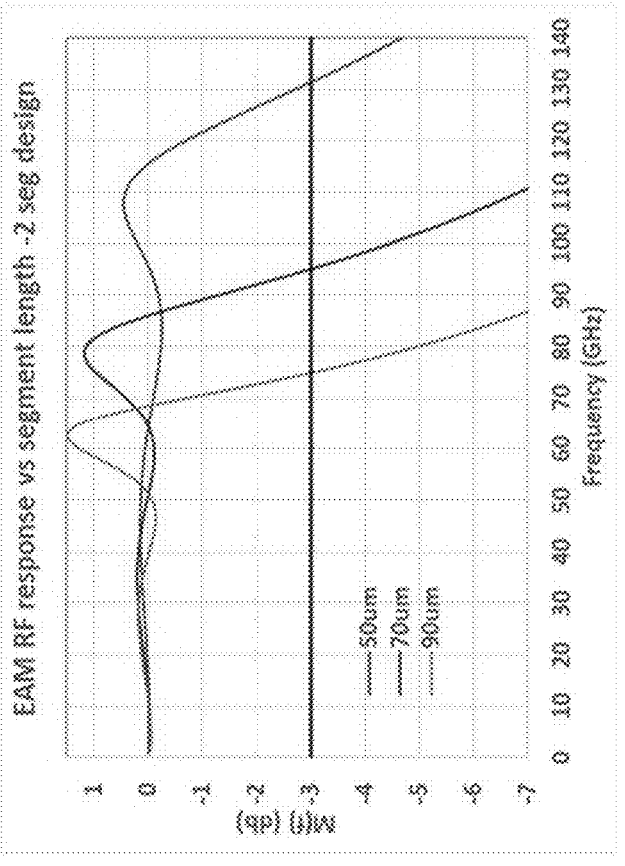
Figure 3B:
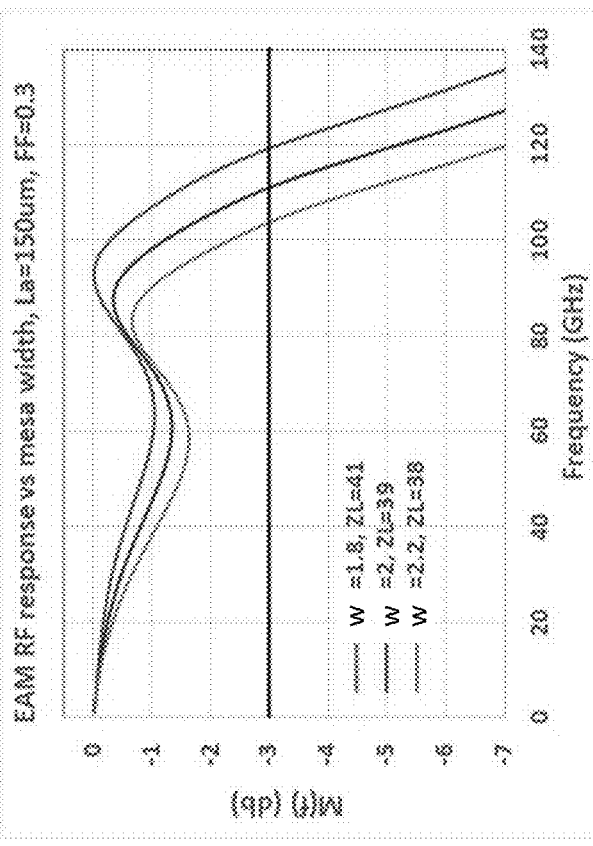
Figure 3B:
Figure 3A:
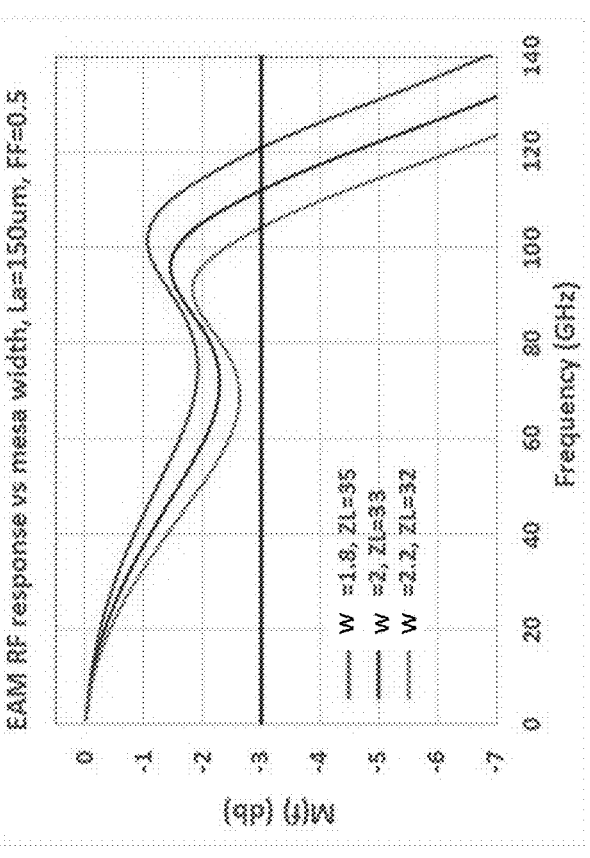
Figure 4B:
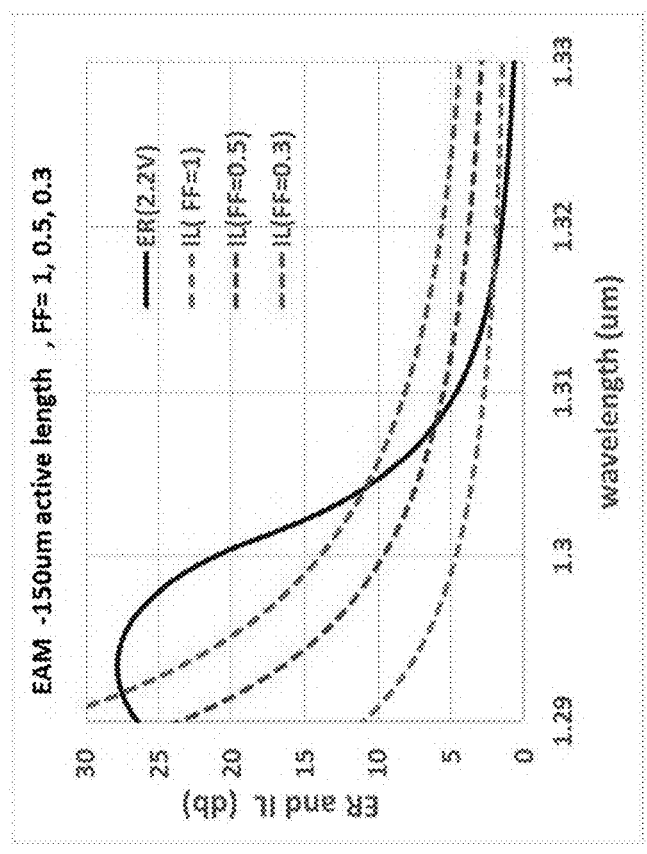
Figure 4A:
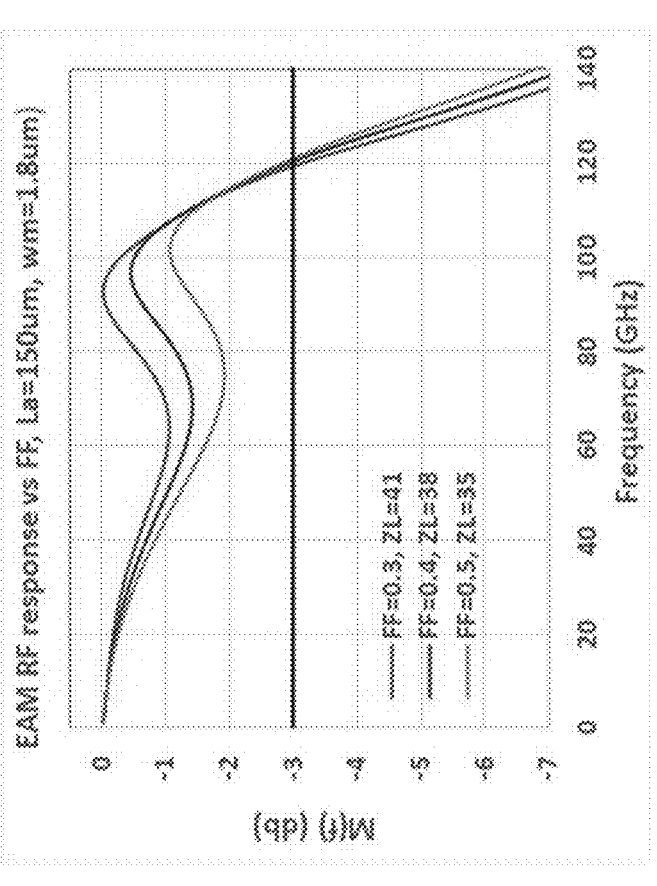
Figures 5, 6, 7:
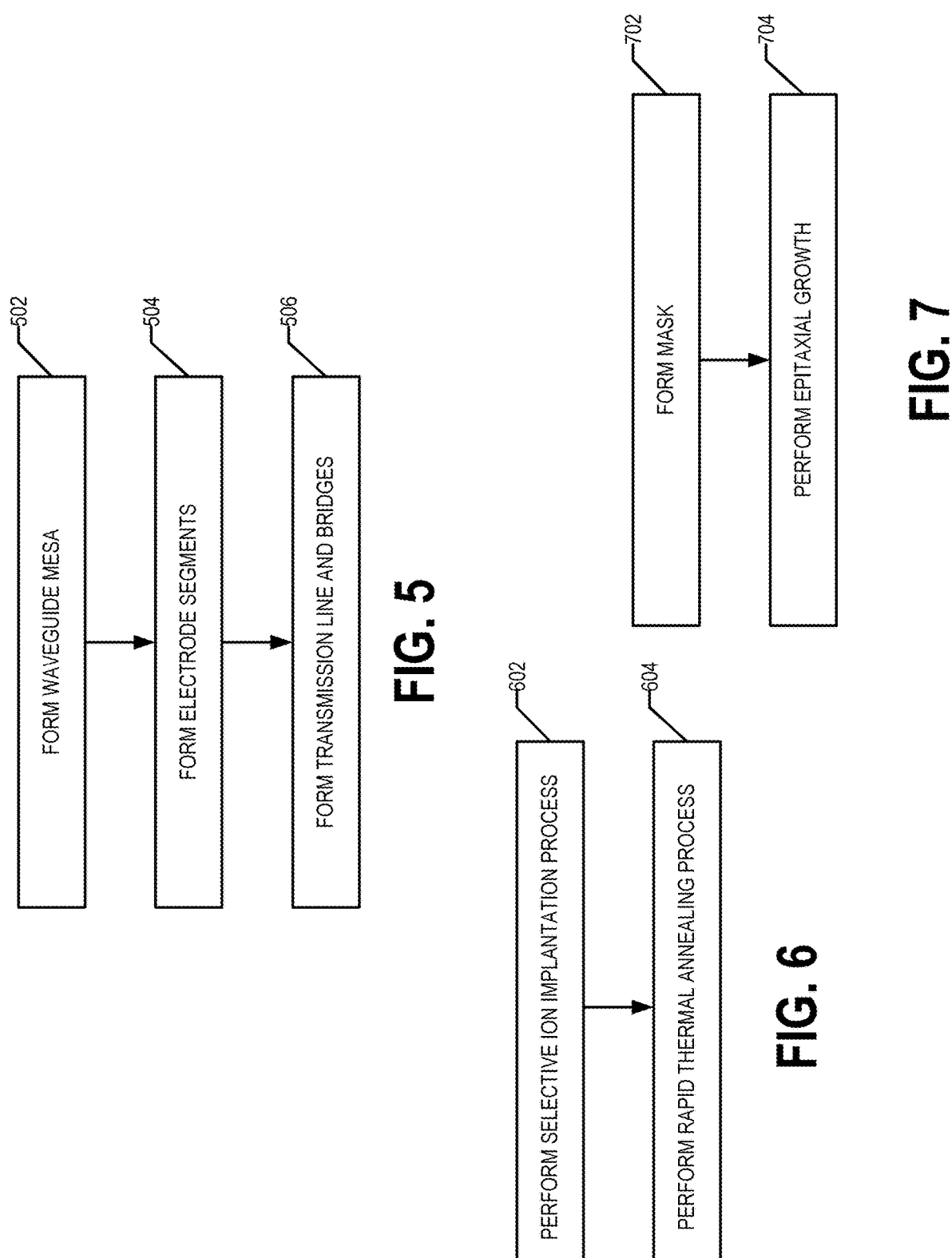
Figure 8:
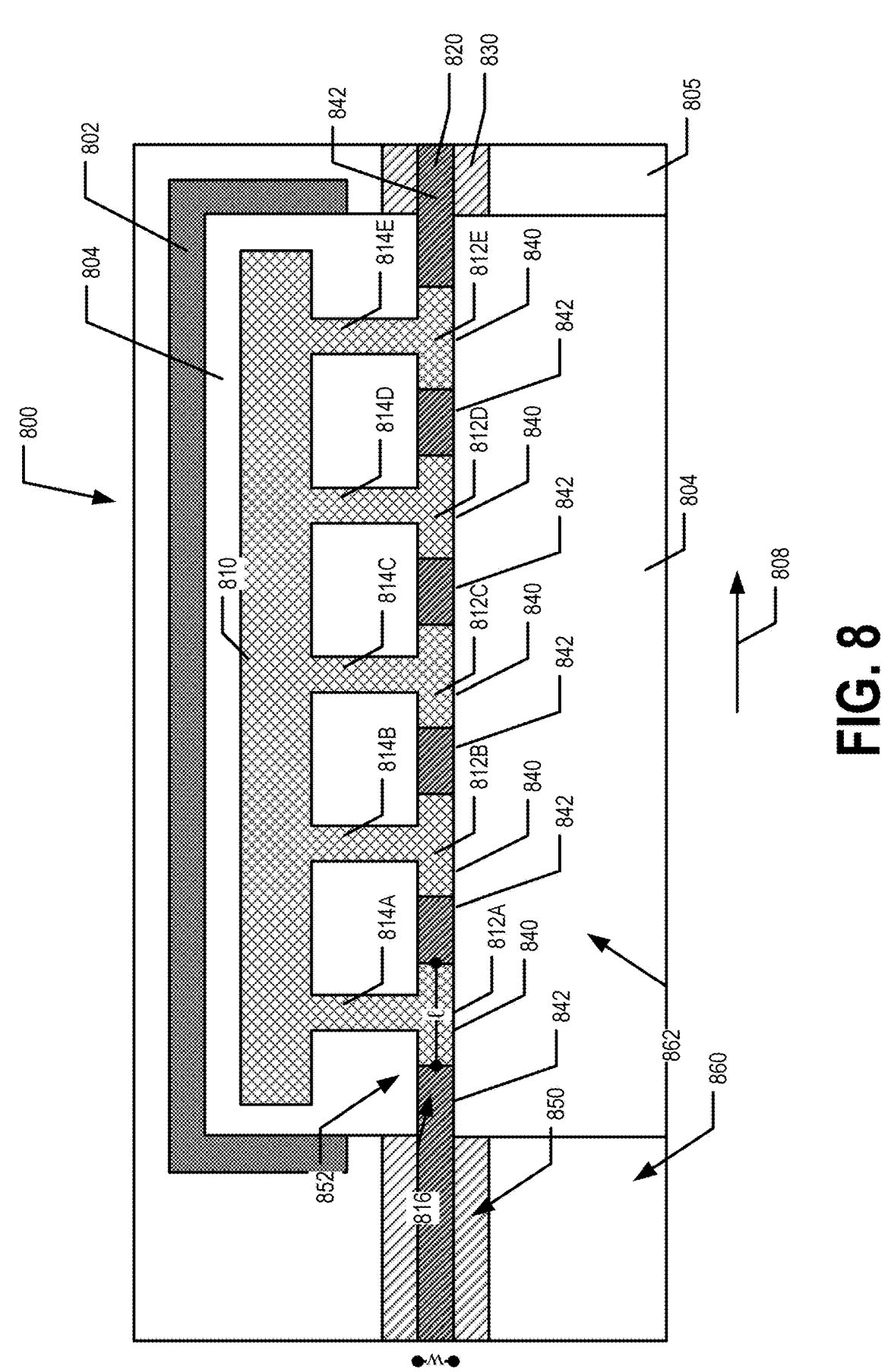

FIG. 2A provides a plot illustrating the modulating frequency response of an EAM device comprising a TWE structure that includes two electrode segments of various segment lengths, in accordance with an example embodiment;

FIG. 2B provides a plot illustrating the modulating frequency response of an EAM device comprising a TWE structure that includes three electrode segments of various segment lengths, in accordance with an example embodiment;

FIG. 3A provides a plot illustrating the modulating frequency response of an EAM device with a FF of 0.5 for waveguide mesas of various widths, in accordance with an example embodiment;

FIG. 3B provides a plot illustrating the modulating frequency response of an EAM device with a FF of 0.3 for waveguide mesas of various widths, in accordance with an example embodiment;

FIG. 4A provides a plot illustrating the modulation frequency response of EAM devices with various FFs, in accordance with an example embodiment;

FIG. 4B provides a plot illustrating the extinction ratio (ER) and insertion loss (IL) of EAM devices with various FFs, in accordance with an example embodiment;

FIG. 5 is a flowchart illustrating various processes, procedures, and/or operations for fabricating an EAM device, according to an example embodiment;

FIG. 6 is a flowchart illustrating various processes, procedures, and/or operations for fabricating a continuous MQW layer of a waveguide mesa, according to an example embodiment;

FIG. 7 is a flowchart illustrating various processes, procedures, and/or operations for fabricating an EAM device, according to another example embodiment;

FIG. 8 is a top view of an example integrated EAM-laser device, according to an example embodiment; and FIG. 9 is a flowchart illustrating various processes, procedures, and/or operations for fabricating an integrated EAM-laser device, according to an example embodiment.

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "about," "around," etc. are used for explanatory purposes in the examples provided below to describe the relative position of certain components or portions of components. As used herein, the terms "substantially" and "approximately" refer to tolerances within appropriate manufacturing and/or engineering standards.

Various embodiments provide high bandwidth (e.g., >100 GHz) EAM devices. In various embodiments, the high bandwidth EAM devices comprise TWE structures that include a plurality of electrode segments disposed on a surface of a waveguide mesa comprising a continuous MQW layer. The fraction of the surface of the waveguide mesa on which the plurality of electrode segments are disposed that is covered by the plurality of electrode segments is referred to as the filing factor. In various embodiments, the EAM device is characterized by a FF of 0.5 or less (e.g., 0.3).

In various embodiments, the continuous MQW layer is formed via a single epitaxial growth process. In various embodiments, the continuous MQW layer comprises alternating active portions and passive portions. The passive portions are portions of the continuous MQW layer of the waveguide mesa on which an electrode segment of the plurality of electrode segments is not disposed and the active portions are portions of the continuous MQW layer of the waveguide mesa on which an electrode segment of the plurality of electrode segments is disposed. The modulation of an optical and/or laser beam passing through the EAM device primarily occurs in the action portions of the continuous MQW layer. The bandgap energy in the active portions is different from the bandgap energy of the passive portions. For example, the energy gap (e.g., between the conduction band and the valence band of the MQW layer material) of the active portions of the continuous MQW layer defines an active energy gap value and the energy gap (e.g., between the conduction band and the valence band of the MQW layer material) of the passive portions of the continuous MQW layer define a passive energy gap value. In various embodiments, the continuous MQW layer is formed (e.g., via a single epitaxial growth process) such that the active energy gap value is less than the passive energy gap value. In an example embodiment, the wavelength corresponding to the active energy gap value is 50-80 nm longer than the wavelength corresponding to the passive energy gap value. In an example embodiment, passive energy gap value is 995 meV and the active energy gap value is 945 meV.

Because $Z_L$ is reciprocally proportional to $C_L$, high $C_L$ values will cause a substantial reduction of the loaded line impedance to values well below the 50 Ohm target, leading to limited modulation BW. For example, an exemplary design recommendation, which is implemented in various embodiments that can be formulated based on the above discussion, is that the designed-mesa $C_L$ value is less than $8C_\mu$. For $C_L=8C_\mu$, the loaded line impedance is $Z_\mu/3$, which is about 30 Ohms, too low for a flat RF response of 100 GHz modulation bandwidth.

On the other hand, it should be taken into account, as discussed in more detail elsewhere herein, that a reduction of mesa capacitance may lead to reduced extinction ratio (ER) and/or increased insertion loss (IL), which are both undesired. Thus, choice of the specific mesa parameters usually involves a tradeoff between IL, ER, and RF-bandwidth contradicting requirements. Thus, technical problems exist regarding the design and fabrication of EAM modulators that provide high ERs, low ILs, and high bandwidth.

Various embodiments provide EAM devices that balance these parameters so as to enable a high modulation BW, low IL, and high ER.

Example EAM Device

Figure 1A:
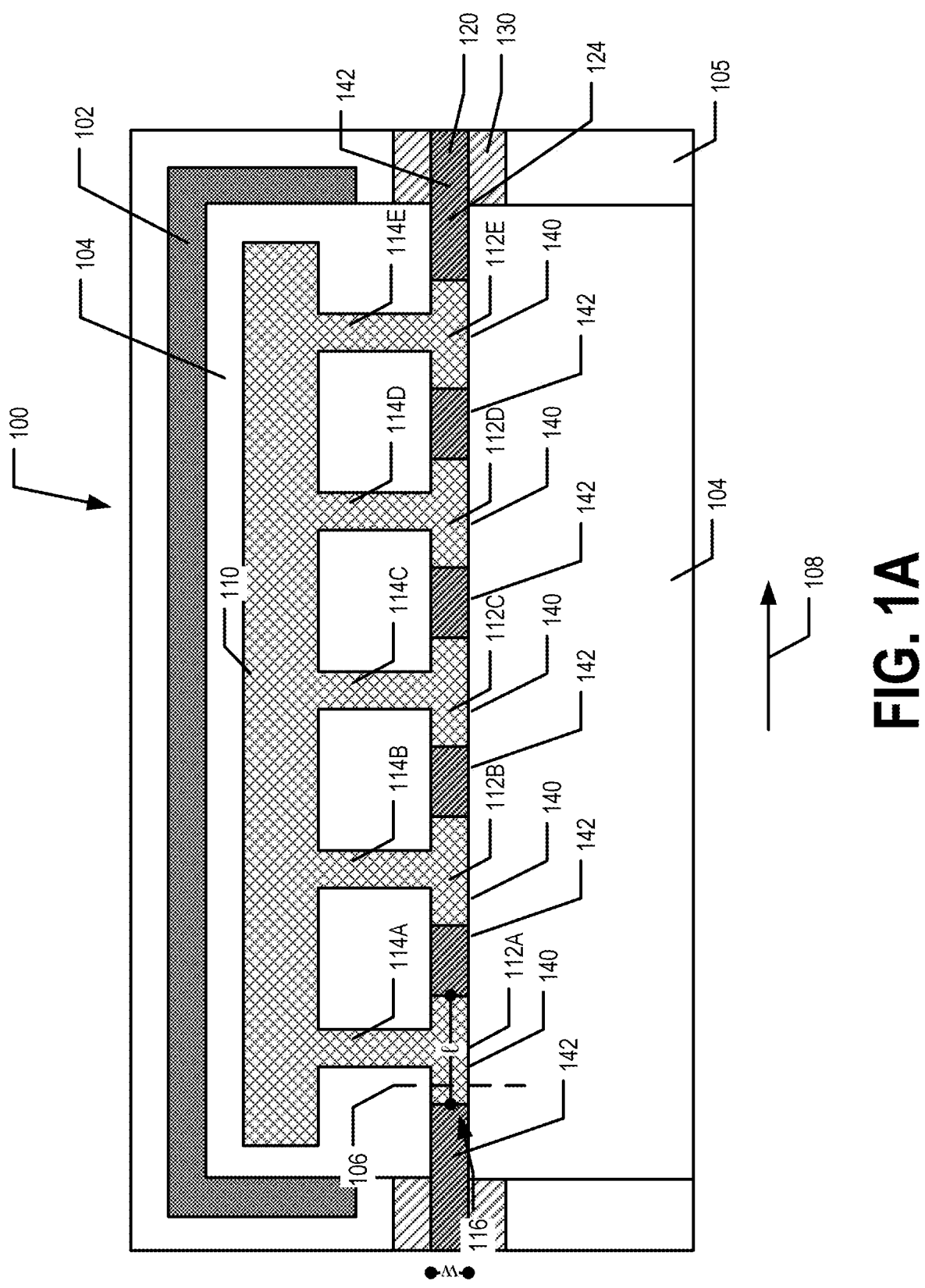
FIG. 1A is a top view of an example EAM device, according to an example embodiment.

FIG. 1A illustrates a top view of an example high bandwidth EAM device 100 of an example embodiment. The EAM device 100 comprises a semiconductor waveguide mesa 120 formed at least in part on a substrate 105. In various embodiments, the semiconductor waveguide mesa 120 extends a modulator length in a modulator propagation direction 108 and has a width w in a direction substantially perpendicular to the propagation direction 108. In an example embodiment, the EAM device 100 is formed on a chip (e.g., on and/or comprising the substrate 105) so as to provide a modulator chip.

In various embodiments, the EAM device 100 comprises a TWE structure including a plurality of electrode segments 116. The plurality of electrode segments 116 comprises two or more electrode segments 112 (e.g., 112A, 112B, 112C, 112D, 112E). In various embodiments, the EAM device 100 further comprises a transmission line 110. The transmission line 110 is in electrical communication with each electrode segment 112 of the plurality of electrode segments 116. For example, each of the electrode segments 112 of the plurality of electrode segments 116 is in electrical communication with the transmission line 110 via a respective conducting bridge 114 (e.g., 114A, 114B, 114C, 114D, 114E).

In various embodiments, the plurality of segmented electrodes 116 and transmission line 110 are configured and/or designed to provide velocity matching of the propagating radio frequency (RF) electrical signal (propagating through the transmission line 110 and/or plurality of electrodes 116) and optical signals (propagating through the waveguide mesa 120) in the EAM device 100.

In various embodiments, the transmission line 110 has a microstrip geometry. This microstrip transmission line 110 includes a conducting line that is formed and/or disposed on an insulating spacer layer 104 (e.g., comprising BCB or other insulating material). The insulating spacer layer 104 is formed and/or disposed on a ground conducting layer 102. In various embodiments, the ground conducting layer 102 is wider (in a direction substantially perpendicular to the propagation direction 108) than the transmission line 110. The RF driving electrode segments 112 are disposed on a surface 124 of the waveguide mesa 120 and provide an RF electric field, which induces modulation of the optical power propagating in the waveguide core of the waveguide mesa 120. The capacitive loading of the transmission line 110 by the segmented electrodes 112 slows down the propagation speed of the RF signals in the transmission line 110 in order to match it with the speed of the propagating light in the waveguide mesa 120 for best modulation efficiency.

In various embodiments, the plurality of electrode segments 116 are periodic. For example, in an example embodiment, each electrode segment 112 of the plurality of electrode segments is a same length (segment length l) in the propagation direction 108, a same width (approximately equal to mesa width w, in an example embodiment) in a direction transverse to the propagation direction 108, and/or separated from the adjacent electrode segment(s) 112 of the plurality of electrode segments 116 by a set distance. In an example embodiment, the length of the electrode segments 112 in the propagation direction 108, the width in a direction transverse to the propagation direction 108, and/or separation between adjacent electrode segments 112 may vary between the electrode segments (e.g., may not be equal for all electrode segments).

In an example embodiment, a plurality of electrode segments 116 forms a capacitive electrode segment train on the waveguide mesa 120. In an example embodiment, the plurality of electrode segments 116 are configured to reduce the propagation velocity of a radio and/or microwave signal propagating through the respective transmission line 110 such that the propagation of velocity of the radio and/or microwave signal through the transmission line is substantially equal to and/or matched to the velocity of light propagating through the waveguide mesa. In various embodiments, the electrode segments 112 and the respective bridges 114 are formed of metal (e.g., gold, copper, and/or the like) and/or another electrically conductive material.

In various embodiments, the transmission line 110 is configured to be coupled to (e.g., in electrical communication with) an output of a radio and/or microwave frequency system. In various embodiments, the radio and/or microwave frequency system is part of and/or controlled by a controller for the optical link and/or other structure, arrangement, and/or system comprising the EAM device 100. For example, the radio and/or microwave frequency system may be a signal generator (e.g., a digital/analog convertor (DAC), arbitrary waveform generator (AWG), local oscillator, and/or the like) configured to generate and/or provide a radio and/or microwave frequency electric signal. In various embodiments, the transmission line 110 is configured to efficiently provide a radio and/or microwave frequency signal to the plurality of electrode segments 116. For example, the transmission line 110 is configured to have low resistance so as to reduce the heat generated as a radio and/or microwave frequency signals propagate through the transmission line 110 and/or to maintain the integrity of (e.g., limit the noise introduced into) the radio and/or microwave frequency signal as the radio and/or microwave frequency signals propagate through the transmission line. For example, the transmission line 110 may be made of metal (e.g., gold, copper, and/or the like) and/or another electrically conductive material.

The waveguide mesa 120 comprises alternating active portions 140 and passive portions 142. The electrode segments 112 are disposed on the active portions 140 of the waveguide mesa 120. The portions of the waveguide mesa 120 between the electrode segments 112 form the passive portions 142 of the waveguide mesa 120. In various embodiments, in order to reduce the excess insertion loss that may occur in the passive portions 142 of the waveguide mesa 120, the MQW layer material of the continuous MQW layer 160 is formed so that the energy gap (e.g., the energy bandgap between the conduction band and the valence band) is higher in the passive portions 142 than in the active portions 140.

Figure 1B:
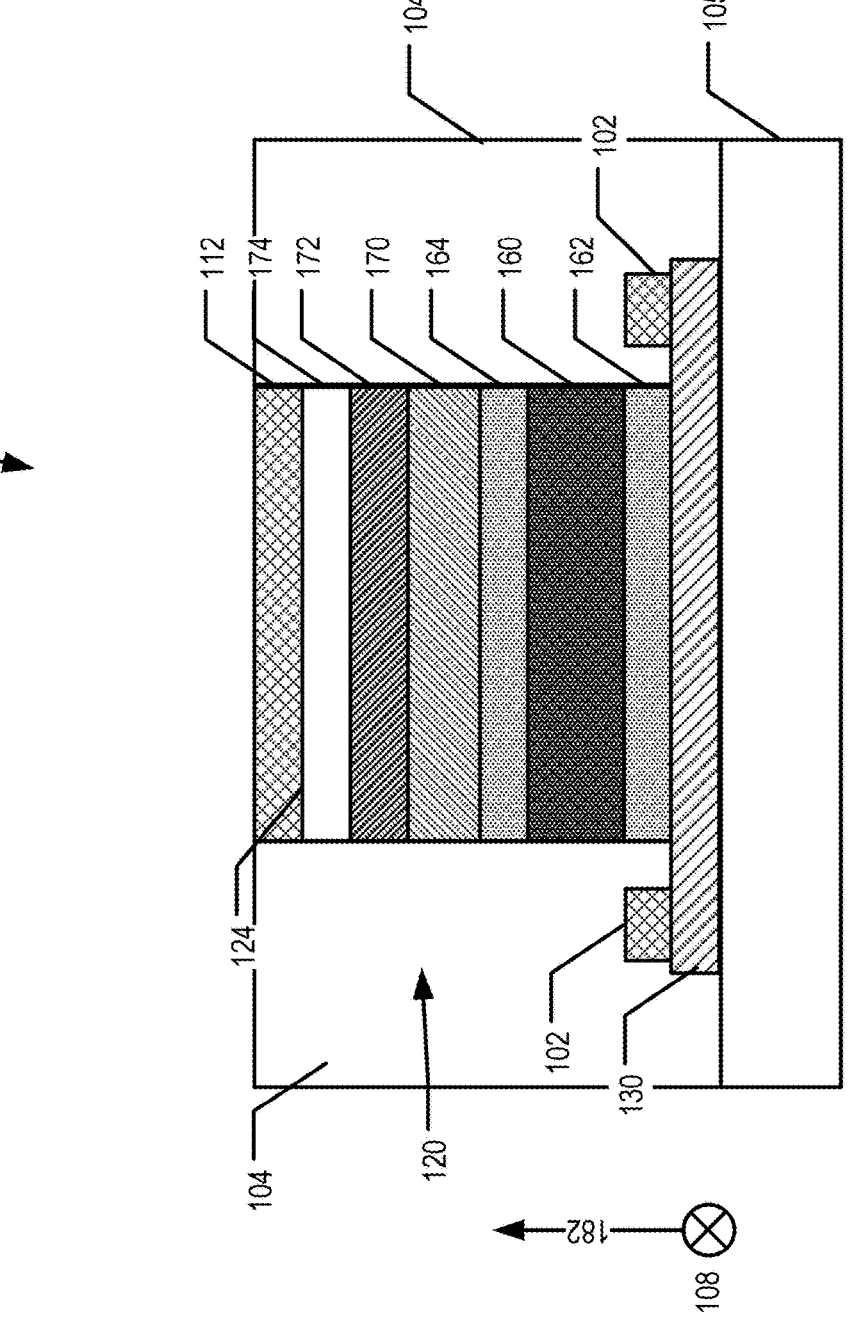
FIG. 1B is a partial cross-sectional view of the example EAM device shown in FIG. 1A, according to an example embodiment.

FIG. 1B illustrates a cross-section of the EAM device 100 taken at line 106. For example, the cross-section of the EAM device 100 shown in FIG. 1B shows a cross-section of the waveguide mesa 120 at a location where an electrode segment 112 is present (e.g., an active portion 140) in a plane that is perpendicular and/or substantially transverse to the propagation direction 108. As should be understood, the cross-section of the waveguide mesa 120 at a location between electrode segments 112 would be similar to that shown in FIG. 1B, but without the electrode segment 112 disposed on the surface 124 of the waveguide mesa 120 that is opposite the substrate 105.

In various embodiments, the semiconductor waveguide mesa is formed on a substrate 105. In an example embodiment, the substrate 105 is an InP substrate. In an example embodiment, the substrate is heavily doped with an n-type dopant. For example, in an example embodiment, the substrate is an N-InP substrate that doped with a dopant density in a range of $1\times10^{18}$ cm$^{-3}$ to $7\times10^{18}$ cm$^{-3}$ (e.g., substantially equal to $4\times10^{18}$ cm$^{-3}$). In an example embodiment, the substrate is approximately 2 to 6 µm (e.g., 4 µm) thick in the mesa height direction 182. In an example embodiment, the mesa height direction 182 is substantially perpendicular to the interfaces between the various layers of the semiconductor waveguide mesa 120.

In various embodiments, the semiconductor waveguide structure comprises a continuous MQW layer 160 disposed between a first optical waveguide peripheral layer 162 and a second optical waveguide peripheral layer 164. For example, in the illustrated embodiment, the first optical waveguide peripheral layer 162 is formed on the substrate 105 (possibly with a buffer layer 130 therebetween in various embodiments). The continuous MQW layer 160 is formed on the first optical waveguide peripheral layer 162 and the second optical waveguide peripheral layer 164 is formed on the continuous MQW layer 160. In various embodiments, the continuous MQW layer 160 is configured to transmit and/or propagate an optical beam and/or signal therethrough. For example, in various embodiments, the continuous MQW layer 160 is configured to act as the waveguide core of the waveguide mesa 120. In various embodiments, the first and second optical waveguide peripheral layers 162, 164 are configured to confine the optical beam and/or signal within the continuous MQW layer 160 and prevent leakage and/or absorption of an optical beam and/or signal propagating through the continuous MQW layer 160 out of the optical waveguide core (e.g., the continuous MQW layer 160).

In various embodiments, the continuous MQW layer 160 and the first and second optical waveguide optical peripheral layers 162, 164 comprise one or more semiconductor materials. In an example embodiment, the first and second waveguide optical peripheral layers 162, 164 are substantially similar to one another than their placement with respect to the continuous MQW layer 160 and the substrate 105. In an example embodiment, the first and second waveguide optical peripheral layers 162, 164 comprise different semiconductor materials, are doped differently, and/or have different thicknesses in the mesa height direction 182.

In an example embodiment, the first and/or second waveguide optical peripheral layers 162, 164 are in a range of 0.05 to 0.10 µm thick in the mesa height direction 182. In an example embodiment, the first and/or second waveguide optical peripheral layers 162, 164 are formed of and/or comprise intrinsic and/or undoped AlGaInAs. In various embodiments, the first waveguide optical peripheral layer 162 is formed on a buffer layer 130 comprising n-type doped InP, for example.

In various embodiments, the continuous MQW layer 160 comprises a plurality of quantum wells. For example, the continuous MQW layer may comprise a stack or a series of quantum wells disposed between a series of (quantum) barriers. In various embodiments, the multi-quantum well and/or dots layers are configured to propagate light and/or an optical beam or signal in the propagation direction 108. In various embodiments, the multi-quantum well and/or dots layers are formed from GaAs or InP-based semiconductor materials. For example, in various embodiments, the continuous MQW layer 160 comprises GaAs and/or InP-based semiconductor materials. In an example embodiment, the continuous MQW layer 160 (and/or the first and/or second optical waveguide peripheral layers 162, 164, near core cladding layer 170, and/or central cladding layer 172) comprise III-V' semiconductor materials (i.e. AlGaAs; InGaAsP; group IV materials such as, for example, Si, GE, SiGe, one or more Si—SiGe compositions; and/or the like).

A near core cladding layer 170 is formed on the second optical waveguide peripheral layer 164. In an example embodiment, the near core cladding layer 170 is formed of and/or comprises p-type doped AlGaInAs and/or another semiconductor material. In various embodiments, the near core cladding layer 170 has a thickness of 0.1 to 0.2 µm in the mesa height direction 182 and/or a p-type dopant density of at least $1\times10^{17}$ cm$^{-3}$ (e.g., greater than or equal to $2\times10^{17}$ cm$^{-3}$ and/or up to $1\times10^{20}$ cm$^{-3}$). In various embodiments, the near core cladding layer 170, the central cladding layer 172, and/or distal cladding layer 174 are configured to reduce the absorption of an optical beam and/or signal propagating through the semiconductor waveguide mesa 120 (e.g., through the waveguide core formed by the continuous MQW layer 160) to prevent its absorption by electrode segments 112, and/or the like.

In an example embodiment, a central cladding layer 172 is formed on the near core cladding layer 170. In various embodiments, the central cladding layer 172 is formed of and/or comprises p-type doped InP and/or another semiconductor material. In various embodiments, the central cladding layer 172 is doped with the same type of dopant as the near core cladding layer 170. In various embodiments, the central cladding layer 172 has a thickness of 1.5 to 2 µm in the mesa height direction 182 and/or a dopant density (p-type or n-type as appropriate for the application) of $1\times10^{18}$ cm$^{-3}$ to $1\times10^{19}$ cm$^{-3}$.

In an example embodiment, a distal cladding layer 174 is formed on the central cladding layer 172. In various embodiments, the distal cladding layer 174 is formed of and/or comprises p-type doped InGaAs and/or another semiconductor material. In various embodiments, the distal cladding layer 174 is doped with the same type of dopant as the near core cladding layer 170 and/or central cladding layer 172. In various embodiments, the distal cladding layer 174 has a thickness of 1.5 to 2 µm in the mesa height direction 182 and/or a dopant density (p-type or n-type as appropriate for the application) of $1\times10^{18}$ cm$^{-3}$ to $1\times10^{19}$ cm$^{-3}$. In various embodiments, the semiconductor material of the distal cladding layer 174 is selected and/or a dopant type and/or dopant density is selected to reduce the resistance between the electrode segments 112 and the semiconductor layers of the semiconductor waveguide mesa 120.

In an example embodiment, the electrode segments 112 are deposited onto the distal cladding layer 174. The EAM device 100 additionally includes a ground contact 102. The ground contact 102 is configured to be placed into electrical communication with ground so as to ground the substrate 105 and/or the semiconductor waveguide mesa 120. In various embodiments, the ground contact 102 is deposited on the substrate 105 and/or in electrical communication therewith. In various embodiments, the ground contact 102 is made of metal (e.g., gold, copper, and/or the like) and/or other conductive material.

FIGS. 2A and 2B illustrate the frequency response of an EAM device 100 comprising two electrode segments 112 (FIG. 2A) and the frequency response of an EAM device

US 12,619,108 B2

9

10

100 comprising three electrode segments 112 (FIG. 2B) with various segment lengths 1 and a FF of 0.3. In various embodiments, the segment length 1 is no more than 65 μm. For example, in various embodiments, the segment length 1 is less than 65 μm to enable the modulation bandwidth of the EAM device 100 to exceed 100 GHz.

FIGS. 3A and 3B illustrate the frequency response of an EAM device 100 comprising three electrode segments 112 with a total active length (e.g., the number of electrode segments multiplied by the segment length 1 or the sum of the segment lengths) of 150 μm for various mesa width w values. FIG. 3A illustrates the frequency response for an EAM device with a FF of 0.5 and FIG. 3B illustrates the frequency response for an EAM device with a FF of 0.33.

As shown in FIG. 3A, the modulation bandwidth is reduced with increasing mesa width. For this specific design, increasing mesa width w from 1.8 to 2.2 um results in a 3 db BW reduction from 120 GHz to 105 GHz. This bandwidth decrease results from the increase in mesa capacitance as the mesa width w increases. An additional effect, which can be observed in FIG. 3A, is the mid-range-response decrease and curved shape of the modulation response, which increases with mesa width. This curving is related to the deviation of the loaded line impedance $Z_L$ from 50 Ohm. It is observed that for designs in which loaded line impedance ZL is smaller than 40Ω, this curving is quite prominent and gets worse as mesa width w increases. As indicated in FIG. 3A, the loaded impedance $Z_L$ becomes smaller as mesa width increases.

FIG. 3B shows the frequency response for a similar design with a lower FF of 0.33. As can be seen, the smaller FF leads to higher $Z_L$ values, closer to 50 Ohms, resulting in a flatter response over the operational frequency range. Comparison of FIGS. 3A and 3B shows that the 3 dB bandwidth value is almost not affected by the change in the FF.

In various embodiments, the mesa width w of the EAM device is less than or than or equal to 2.3 μm. In an example embodiment, the mesa width w of the intrinsic region is 1.7 μm≤w≤2.3 μm.

FIG. 4A shows the frequency response for an EAM device 100 comprising three electrode segments 112 with a total active length $L_a$=150 μm and a mesa width w=1.8 μm for various FFs. As shown in FIG. 4A, the 3 db modulation bandwidth is nearly not affected by the FF change. However, the bending of the curves in the mid-frequency regime is reduced and the flatness is improved with decreasing FF value. The reason for this is the improved $Z_L$ values (closer to 50 Ohms) obtained for lower FF ratios.

In various embodiments, the FF of the EAM device 100 is less than or less than or equal to 0.5. In an example embodiment, the FF of the EAM device 100 is at least 0.15. In an example embodiment, the FF of the EAM device is in the range of 0.25 to 0.35 (e.g., approximately 0.3).

FIG. 4B illustrates the extinction ratio and insertional loss of an EAM device 100 where the energy gap of the continuous MQW layer 160 is consistent and/or the same along the entire length of the MQW layer 160. When the FF is less than 0.5, the combined length of the passive portions 142 of the waveguide mesa 120 is larger than the combined length of the active portions 140. Since these passive portions 142 are composed of the same MQW material as the active portions 140, a noticeable absorption loss in the passive portions 142 should be expected to take place, resulting in increasing insertion loss with decreasing FF, as shown in FIG. 4B.

In various embodiments, the excess absorption loss in the passive portions 142 of the waveguide mesa 120 are reduced by increasing the energy gap between the conduction band and the valence band of the MQW layer material in the passive portions 142. This results in a waveguide mesa 120 that includes a continuous MQW layer 160 that does not include any butt joints therein and that includes portions having different energy gaps between the conduction band and the valence band of the MQW layer material. The increased energy gap in the passive portions 142 reduces the absorption within the passive portions 142 and therefore reduces the overall insertion loss. The energy gap between the conduction band and the valence band is also referred to as the bandgap herein.

In order to prevent butt joints or other discontinuities between the active portions 140 and the passive portions 142 of the waveguide mesa 120 which may result in additional losses, the continuous MQW layer 160 is formed in a single epitaxial growth process, in various embodiments.

In an example embodiment, the formation of a continuous MQW layer 160 formed in a single epitaxial growth process and having different energy gaps between the conduction band and valence band in different portions of the continuous MQW layer 160 is achieved by adding a quantum well intermixing (QWI) process to the device fabrication process. The QWI process is implemented by an ion implantation step followed by a rapid thermal annealing (RTA) step, which causes a blue shift of the MQW bandgap in the implanted MQW regions. Selective implantation in the passive portions 142 can thus substantially reduce the waveguide absorption factor in passive portions 142, leading to a highly reduced absorption loss. EAM devices 100 with filling factors of 0.5 or less exhibit insertion losses that are similar to those observed in FF=1 or continuous electrode devices having electrode lengths similar to the combined electrode length of the EAM device 100. Thus, various embodiments enable the use of low filling factors to enable increased bandwidth while achieving low insertion loss.

In various embodiments, the use of a QWI process is valid to both the III-V material quantum wells and to the SiGe system materials, which are used for implementation of Quantum Confined Stark Effect (QCSE) MQW modulators in Si-photonics platforms.

In an example embodiment, the formation of a continuous MQW layer 160 formed in a single epitaxial growth process and having different energy gaps between the conduction band and valence band in different portions of the continuous MQW layer 160 is achieved through the use of a selective area growth (SAG) mask for epi-growth of the active portions 140 of the continuous MQW layer 160. The SAG method is implemented by the implementation of a proper SiO2 mask in the vicinity of the active portions 142, which leads to a red shift of the MQW bandgap in the active portions 142 of the continuous MQW layer 160. Thus, a continuous MQW layer with different bandgaps at different wafer locations can be tailored in a single epitaxial growth process.

For example, in various embodiments, the continuous MQW layer 160 of the EAM device 100 has different bandgaps at different locations along the length of the continuous MQW layer 160. For example, in various embodiments, the EAM device comprises a continuous MQW layer 160 that is formed through a single epitaxial growth process such that the continuous MQW layer 160 of the EAM device 100 has different bandgaps at different locations along the length of the continuous MQW layer.

Example Method of Fabricating an EAM Device

FIG. 5 provides a flowchart illustrating processes, procedures, operations, and/or the like for fabricating an EAM device 100, in accordance with an example embodiment. Starting at step/operation 502, a waveguide mesa 120 is formed on a substrate 105. For example, a first peripheral waveguide layer 162 is formed, deposited, and/or epitaxially grown on the substrate 105 and/or buffer layer 130. The continuous MQW layer 160 is then formed, deposited, and/or epitaxially grown on the first peripheral waveguide layer 162. In various embodiments, the continuous MQW layer is formed through a single epitaxial growth process. In various embodiments, the continuous MQW layer 160 is formed through a single epitaxial growth process such that the bandgap is different at different points along the length of the continuous MQW layer 160. A second optical waveguide peripheral layer 164 is then formed on the continuous MQW layer 160. A near core cladding layer 170 is then formed on the second optical waveguide peripheral layer 164, a central cladding layer 172 is formed on the near core cladding layer 170, and a distal cladding layer 174 is formed on the central cladding layer 172. In an example embodiment, the formed layers may then be etched to form the waveguide mesa 120.

In various embodiments, the continuous MQW layer 160 is formed through a single epitaxial growth process such that the bandgap is different at different points along the length of the continuous MQW layer 160. For example, the energy gap between the conductance band and the valence band of the MQW layer material may alternate between different portions of the continuous MQW layer 160. FIGS. 6 and 7 each provide a flowchart that illustrates an example technique for forming a continuous MQW layer 160 using a single epitaxial growth process with a bandgap that is different at different points along the length of the continuous MQW layer 160.

FIG. 6 illustrates processes, procedures, operations, and/or the like for forming a continuous MQW layer 160 using a single epitaxial growth process with a bandgap that is different at different points along the length of the continuous MQW layer 160 using a QWI process. Starting at step/operation 602, an epitaxial growth process is performed to form a uniform bandgap MQW layer and a selective ion implantation process is performed on the uniform bandgap MQW layer. In an example QWI process, where the uniform bandgap MQW layer comprises InP-based materials, P+ ions are implanted with a kinetic energy of 100 keV and a dose $5 \times 10^{14}$ cm$^{-2}$. For example, the selection ion implantation process may be performed such that the MQW layer comprises alternating portions that include implanted ions and portions that do not include implanted ions. The presence of the ions in the portions where the ions were implanted causes the bandgap to be different in the portions where the ions were implanted compared to where the ions were not implanted in the MQW layer.

At step/operation 604, a rapid thermal annealing process is performed. In an example embodiment, the rapid thermal annealing process is performed to enable efficient optical beam propagation through the continuous MQW layer 160. For example, the rapid thermal annealing process may heal some of the damage to the continuous MQW layer 160 caused by the ion implantation. In an example embodiment, the rapid thermal annealing process comprises heating the MQW layer to an annealing temperature of 570-750° C. for an annealing time of 1 to 5 minutes, depending, at least in part, on the targeted diffusion depth.

The resulting continuous MQW layer 160 comprises portions with larger energy gaps between the conduction band and the valence band in the area where the ions were implanted compared to the areas where the ions were not implanted. For example, the areas where the ions were implanted are the passive portions of the continuous MQW layer 160 and the areas where the ions were not implanted are the active portions of the continuous MQW layer 160, in an example embodiment.

FIG. 7 illustrates processes, procedures, operations, and/or the like for forming a continuous MQW layer 160 using a single epitaxial growth process with a bandgap that is different at different points along the length of the continuous MQW layer 160 using a SAG process. Starting at step/operation 702, a mask is formed on the first peripheral waveguide layer 162. For example, an SiO$_2$ mask may be formed. In an example embodiment, a plurality or series of masks are defined such that the masks corresponds to the portions of the continuous MQW layer 160 that will have lower energy gaps between the conduction band the valence band. For example, a plurality or series of masks may be defined that define the active portions of the resulting continuous MQW layer 160.

At step/operation 704, an epitaxial growth process is performed through the mask (or plurality or series of masks) to form the continuous MQW layer 160 with different bandgaps at different portions of the MQW layer 160.

Continuing with FIG. 5, at step/operation 504, the electrode segments 112 are formed. For example, conductive material to be shaped into the electrode segments 112 may be deposited onto the distal cladding layer 174 and shaped to form the electrode segments 112.

At step/operation 506, the transmission line 110 is formed. For example, conductive material to be shaped into the transmission 110 may be deposited onto an insulating spacer layer 104 disposed adjacent the waveguide mesa 120 on the substrate 105. For example, after the waveguide mesa 120 is formed, an insulating spacer layer 104 may be formed about the waveguide mesa 120 on the substrate 105 and the transmission 110 may be formed thereon. The transmission line 110 may then be shaped. In an example embodiment, the ground contact 102 and/or bridges 114 are also deposited.

In an example embodiment, the electrode segments 112, bridges 114, and transmission line 110 are formed through a same metal deposition and shaping process. For example, an (masked) etching process may be used to etch conductive material deposited onto the distal cladding layer 174 and insulating spacer layer 104 into a plurality of electrode segments 116, bridges 114, and the transmission line 110.

Example Integrated EAM-Laser Device

In various embodiments, an integrated EAM-laser device is provided. FIG. 8 provides a top view of an example integrated EAM-laser device 800, according to an example embodiment. The integrated EAM-laser device 800 comprises a semiconductor waveguide mesa 820 formed at least in part on a substrate 805. The integrated EAM-laser device 800 comprises a laser part 860 and a modulator portion 862. The waveguide mesa 820 comprises a laser part 850 of the waveguide mesa 820 and a waveguide part 852 of the waveguide mesa 820. The laser part 850 of the waveguide mesa 820 is disposed in the laser part 860 of the integrated EAM-laser device 800 and the waveguide part 852 of the waveguide mesa 820 is disposed in the modulator part 862 of the integrated EAM laser device 800.

The laser part 850 of the waveguide mesa 820 comprises part of a continuous MQW layer that is used as the gain material of a semiconductor laser. The waveguide part 852 of the waveguide mesa 820 of the integrated EAM-laser device 800 is part of an EAM modulator similar to EAM modulator 100. In various embodiments, the waveguide part 852 of the integrated EAM-laser device 800 extends a modulator length in a modulator propagation direction 808 and has a width w in a direction substantially perpendicular to the propagation direction 808. In an example embodiment, the integrated EAM-laser device 800 is formed on a chip (e.g., on and/or comprising the substrate 805) so as to provide a laser-modulator chip.

In various embodiments, the laser part 860 of the integrated EAM-laser device 800 comprises the laser part 850 of the waveguide mesa 820, contacts for applying a driving signal to the gain media (e.g., the part of the continuous MQW layer 160 of the laser part 850 of the waveguide mesa 820), one or more electrical and/or optical confinement structures of the driving signal and/or light generated by the gain media (e.g., oxide profiles, ion implantation regions, and/or the like). The laser part 860 of the integrated EAM-laser device 800 is configured to generate a laser beam and/or pulses and cause the laser beam and/or pulses to propagate through the waveguide part 852 of the waveguide mesa 820 in the propagation direction 808. The modulator part 862 of the EAM-laser device 800 is configured to modulate the laser beam and/or pulses as they traverse the waveguide part 852 of the waveguide mesa 820 to encode and/or embed an information signal in the optical signal provided by the integrated laser device 800. For example, an optical signal having an information signal encoded and/or embedded therein may be provided to an optical fiber, free space optics, an optical transceiver and/or receiver, and/or the like, in various embodiments.

In various embodiments, the modulator part 862 of the integrated EAM-laser device 800 comprises a TWE structure including a plurality of electrode segments 816. The plurality of electrode segments 816 comprises two or more electrode segments 812 (e.g., 812A, 812B, 812C, 812D, 812E). In various embodiments, the modulator part 862 of the integrated EAM-laser device 800 further comprises a transmission line 810. The transmission line 810 is in electrical communication with the plurality of electrode segments 816. For example, each of the electrode segments 812 of the plurality of electrode segments 816 is in electrical communication with the transmission line 810 via a respective conducting bridge 814 (e.g., 814A, 814B, 814C, 814D, 814E).

In various embodiments, the plurality of segmented electrodes 816 and transmission line 810 are configured and/or designed to provide velocity matching of the propagating radio frequency (RF) electrical signal (propagating through the transmission line 810 and/or plurality of electrodes 816) and optical signals (propagating through the waveguide part 852 of the waveguide mesa 820) in the integrated EAM-laser device 800.

In various embodiments, the transmission line 810 has a microstrip geometry. This microstrip transmission line 810 includes a conducting line that is formed and/or disposed on an insulating spacer layer 804 (e.g., comprising BCB or other insulating material). The insulating spacer layer 804 is formed and/or disposed on a ground conducting layer 802. In various embodiments, the ground conducting layer 802 is wider (in a direction substantially perpendicular to the propagation direction 808) than the transmission line 810. The RF driving electrode segments 812 are disposed on a surface 824 of the waveguide part 852 of the waveguide mesa 820 and provide an RF electric field, which induces modulation of the optical power propagating in the waveguide core of the waveguide part 852 of the waveguide mesa 820. In an example embodiment, the optical power propagating in the waveguide core (e.g., the continuous MQW layer) of the waveguide part 852 of the waveguide mesa 820 is generated by the laser part 860 of the integrated EAM-laser device 800 using the laser part 850 of the waveguide mesa 820 as a gain material. The capacitive loading of the transmission line 810 by the segmented electrodes 812 slows down the propagation speed of the RF signals in the transmission line 810 in order to match it with the speed of the propagating light in the waveguide part 852 of the waveguide mesa 820 for best modulation efficiency.

In various embodiments, the plurality of electrode segments 816 are periodic. For example, in an example embodiment, each electrode segment 812 of the plurality of electrode segments is a same length (segment length l) in the propagation direction 808, a same width in a direction transverse to the propagation direction 808 (e.g., approximately the mesa width w, in an example embodiment), and/or separated from the adjacent electrode segment(s) 812 of the plurality of electrode segments 116 by a set distance. In an example embodiment, a plurality of electrode segments 816 forms a capacitive electrode segment train on the waveguide mesa 820. In an example embodiment, the plurality of electrode segments 816 are configured to reduce the propagation velocity of a radio and/or microwave signal propagating through the transmission line 810 such that the propagation of velocity of the radio and/or microwave signal through the transmission line is substantially equal to and/or matched to the velocity of light propagating through the waveguide part 852 of the waveguide mesa 820. In various embodiments, the electrodes 812 and the respective bridges 814 are formed of metal (e.g., gold, copper, and/or the like) and/or another electrically conductive material.

In various embodiments, the transmission line 810 is configured to be coupled to (e.g., in electrical communication with) an output of a radio and/or microwave frequency system. In various embodiments, the radio and/or microwave frequency system is part of and/or controlled by a controller for the optical link and/or other structure, arrangement, and/or system comprising the integrated EAM-laser device 800. For example, the radio and/or microwave frequency system may be a signal generator (e.g., a digital/analog convertor (DAC), arbitrary waveform generator (AWG), local oscillator, and/or the like) configured to generate and/or provide a radio and/or microwave frequency electric signal. In various embodiments, the transmission line 810 is configured to efficiently provide a radio and/or microwave frequency signal to the plurality of electrode segments 816. For example, the transmission line 810 is configured to have low resistance so as to reduce the heat generated as a radio and/or microwave frequency signals propagate through the transmission line 810 and/or to maintain the integrity of (e.g., limit the noise introduced into) the radio and/or microwave frequency signal as the radio and/or microwave frequency signals propagate through the transmission line. For example, the transmission line 810 may be made of metal (e.g., gold, copper, and/or the like) and/or another electrically conductive material.

The waveguide part 852 of the waveguide mesa 820 comprises alternating active portions 840 and passive portions 842. The electrode segments 812 are disposed on the active portions 840 of the waveguide part 852 of the waveguide mesa 820. The portions of the waveguide part 852 of the waveguide mesa 820 between the electrode segments 812 form the passive portions 842 of the waveguide mesa 820. In various embodiments, in order to reduce the excess insertion loss that may occur in the passive portions 842 of the waveguide part 852 of the waveguide mesa 820, the MQW layer material of the continuous MQW layer 160 is formed so that the energy gap (e.g., the energy bandgap between the conduction band and the valence band) is higher in the passive portions 842 than in the active portions 840. In an example embodiment, the energy gap (e.g., the energy bandgap between the conduction band and the valence band) of the part of the continuous MQW layer in the laser part 850 of the waveguide mesa 820 is less than the active portion 140 energy gap and less than the passive portion 142 energy gap.

In various embodiments, a cross-section of the integrated EAM-laser device 800 taken substantially perpendicular to the propagation direction 808 and at an active portion 842 of the modulator part 862 of the integrated EAM-laser device 800 is similar to that shown in FIG. 1B and described above. In particular, the waveguide mesa 820 comprises a continuous MQW layer that extends the length of the waveguide mesa 820 as continuous layer of MQW layer material (e.g., with no butt joints) from the laser part 850 of the waveguide mesa 820 through the modulator part 852 of the waveguide mesa 820.

In various embodiments, the segment length l is no more than 65 μm. For example, in various embodiments, the segment length l is less than 65 μm to enable the modulation bandwidth of the integrated EAM-laser device 800 to exceed 100 GHz.

In various embodiments, the mesa width w of the integrated EAM-laser device 800 is less than or than or equal to 2.3 μm. In an example embodiment, the mesa width w of the intrinsic region is 1.7 μm≤w≤2.3 μm.

In various embodiments, the FF of the EAM device 100 is less than or less than or equal to 0.5. In an example embodiment, the FF of the EAM device 100 is at least 0.15. In an example embodiment, the FF of the EAM device is in the range of 0.25 to 0.35 (e.g., approximately 0.3).

In order to prevent butt joints or other discontinuities between the laser part 850, active portions 840, and the passive portions 842 of the waveguide mesa 820, which may result in additional losses, the continuous MQW layer of the waveguide mesa 820 is formed in a single epitaxial growth process, in various embodiments.

In an example embodiment, the formation of a continuous MQW layer formed in a single epitaxial growth process and having different energy gaps between the conduction band and valence band in the laser part 850 and the active and passive portions 840, 842 of the continuous MQW layer is achieved by adding a QWI process to the device fabrication process. The QWI process is implemented by an ion implantation step followed by a RTA step, which causes a blue shift of the MQW bandgap in the implanted MQW regions. Selective implantation in the passive portions 842 can thus substantially reduce the waveguide absorption factor in passive portions 842, leading to a highly reduced absorption loss EAM devices 100 with filling factors of 0.5 or less exhibit insertion losses that are observed in FF=1 or continuous electrode devices. Thus, various embodiments enable the use of low filling factors to enable increased bandwidth while achieving low insertion loss. Additionally, a small density selective implantation in the active portions 840 can enable the laser part 850 of the waveguide mesa 820 that is configured to act as the gain media of the laser part 860 of the integrated EAM-laser device 800 to be formed from the same continuous MQW layer as the active and passive portions 840, 842 of the modulator part 862 of the integrated EAM-laser device 800.

In various embodiments, the use of a QWI process is valid to both the III-V material quantum wells and to the SiGe system materials, which are used for implementation of Quantum Confined Stark Effect (QCSE) MQW modulators in Si-photonics platforms.

In an example embodiment, the formation of a continuous MQW layer formed in a single epitaxial growth process and having different energy gaps between the conduction band and valence band in different parts and/or portions of the continuous MQW layer is achieved through the use of a SAG mask for epi-growth of the laser part 850 and active portions 840 of the continuous MQW layer. The SAG method is implemented by the implementation of a proper $SiO_2$ mask in the vicinity of the laser part 850 and the active portions 842, which leads to a first red shift of the MQW bandgap in the laser part 850 and a second red shift of the MQW bandgap in the active portions 142 of the continuous MQW layer. The first redshift is greater than the second redshift such that the energy gap of the laser part 850 is less than the energy gap of the active portions 840, which is less than the energy gap of the passive portions 840. Thus, a continuous MQW layer with different bandgaps at different wafer locations can be tailored in a single epitaxial growth process.

For example, in various embodiments, the continuous MQW layer of the integrated EAM-laser device 800 has different bandgaps at different locations along the length of the continuous MQW layer. For example, in various embodiments, the integrated EAM-laser device 800 comprises a continuous MQW layer that is formed through a single epitaxial growth process such that the continuous MQW layer of the integrated EAM-laser device 800 has different bandgaps at different locations along the length of the continuous MQW layer.

Example Method of Fabricating an Integrated EAM-Laser Device

FIG. 9 provides a flowchart illustrating various processes, procedures, operations, and/or the like for fabricating an integrated EAM-laser device 800, according to an example embodiment. Starting at step/operation 902, a waveguide mesa 820 is formed such that a continuous MQW layer is formed using a single epitaxial layer and such that the continuous MQW layer comprises a laser part 850 and a waveguide part 852 where the waveguide part comprises alternating passive portions 842 and active portions 840.

For example, in an example embodiment, a QWI process is used to form the continuous MQW layer using a single epitaxial growth process such that the bandgap of the MQW layer material in the laser part 850 has a laser energy gap value, the bandgap of the MQW layer material in the active portions 840 of the waveguide part 852 has an active energy gap value, and the bandgap of the MQW layer material in the passive portions 842 have a passive energy gap value. In various embodiments, that the passive energy gap value is greater than the active energy gap value and the active energy gap value is greater than the laser energy gap value. For example, for an example EAM device 100 configured to operate on C-band optical signals, the laser energy gap value corresponds to a wavelength of 1545 nm, the active energy gap value corresponds to a wavelength of 1505 nm, and the passive energy gap value corresponds to a wavelength of 1440 nm. In another example, for an example EAM device 100 configured to operate on O-band optical signals, the laser energy gap value corresponds to a wavelength of 1315 nm, the active energy gap value corresponds to a wavelength of 1280 nm, and the passive energy gap value corresponds to a wavelength of 1215 nm.

For example, in various embodiments, selective ion implantation may be used to form a continuous MQW layer with a three bandgap material scheme. For example, following an ion implantation dosage into the passive and active portions 842 and 840, a first rapid thermal anneal is performed, followed by selective removal of the implanted layer from the active portions 842. Then, a second rapid thermal anneal at the same or somewhat higher temperature (compared to the first rapid thermal anneal) is performed to increase the bandgap in the passive portions 840. In an example embodiment in which the MQW layer comprises InP-based materials, the ion implantation process includes implanting P+ ins of 100 keV energy at a dosage of $5 \times 10^{14}$ $cm^{-2}$. An example of the first rapid thermal anneal is performed at an annealing temperature of 675° C. for an annealing time of 1 minute. After selective removal of the implanted layer from the active portions 840, a second rapid thermal anneal is performed at an annealing temperature of 675° C. for an annealing time of 1 to 3 minutes to cause the bandgap shifting in the passive portions 842. In various embodiments, a SAG process is used to form the continuous MQW layer using a single epitaxial growth process such that the bandgap of the MQW layer material in the laser part 850 has a laser energy gap value, the bandgap of the MQW layer material in the active portions 840 of the waveguide part 852 has an active energy gap value, and the bandgap of the MQW layer material in the passive portions 842 have a passive energy gap value. In various embodiments, that the passive energy gap value is greater than the active energy gap value and the active energy gap value is greater than the laser energy gap value.

For example, in various embodiments, a mask and/or a plurality of masks may be defined such that a higher redshift of the bandgap energy is implemented in the laser part 850 of the continuous MQW layer and a lower redshift of the bandgap energy is implemented in the active portions 840 of the waveguide part 852 of the continuous MQW layer. For example, a wide SAG mask (a mask that is wider than the SAG mask(s) used to form the active portions 842 of the waveguide part 852) may be formed at the location on the substrate 105 (and/or buffer layer 130) where the laser part 850 is to be formed and narrow SAG masks (masks that are narrow than the SAG mask used to form the laser part 850) may be formed at the locations on the substrate 105 (and/or buffer layer 130) where the active portions 804 of the waveguide part 852 are to be formed. An epitaxial growth process may then be performed, using the SAG masks, to form a continuous MQW layer having a laser part 850 with a smallest energy gap value, passive portions 842 having largest energy gap values, and active portions 840 having energy gap values that are between the laser energy gap value and the passive energy gap value.

At step/operation 904, one or more electrical and/or optical confinement structures of the laser part 860 of the integrated EAM-laser device 800 are formed. For example, one or more electrical and/or optical confinement structures are formed so as to confine current flow and/or optical flow through the laser part 860.

At step/operation 906, the conductive material is deposited and shaped into the electrode segments, transmission line, bridges, and laser contacts. For example, the transmission line may be formed on the insulating spacer layer 804, the electrode segments are formed on the waveguide mesa 820, and the bridges 814 are formed so as to place the transmission line 810 in electrical communication with the electrode segments 812. Laser contacts configured to applying laser driving signals to the laser part 860 of the integrated EAM-laser device 800 may also be formed.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. An electro-absorption modulator (EAM) device comprising:
   a waveguide mesa comprising a continuous multi-quantum well (MQW) layer;
   a segmented travelling wave electrode (TWE) structure comprising a plurality of electrode segments disposed on the waveguide mesa; and
   a microstrip transmission line disposed on an insulating spacer layer and in electrical communication with the segmented TWE structure via conducting bridges,
   wherein:
      the waveguide mesa comprises alternating active sections and passive sections,
      each electrode segment of the plurality of electrode segments is disposed on a respective one of the active sections,
      portions of the continuous MQW layer disposed in respective longitudinal portions of each of the active sections have an energy gap defining an active energy gap value,
      portions of the continuous MQW layer disposed in respective longitudinal portions of each of the passive sections have an energy gap defining a passive energy gap value, and
      each active energy gap value is less than each passive energy gap value.

2. The EAM device of claim 1, wherein the continuous MQW layer is formed using a single epitaxial growth process.

3. The EAM device of claim 2, wherein a quantum well intermixing process and rapid thermal annealing process are performed after the single epitaxial growth process to cause the active energy gap value to be different from the passive energy gap value.

4. The EAM device of claim 2, wherein a selective area growth method is used to form the continuous MQW layer using the single epitaxial growth process.

5. The EAM device of claim 1, wherein each of the plurality of electrode segments has a length in a propagation direction defined by the waveguide mesa that is less than 65 microns.

6. The EAM device of claim 1, wherein the EAM device has an electrode filling factor of less than 0.5.

7. The EAM device of claim 6, wherein the EAM device has an electrode filling factor substantially equal to 0.3.

8. The EAM device of claim 1, wherein the EAM device has a mesa waist of less than 2.3 um.

9. An integrated electro-absorption modulator (EAM)-laser device comprising:

a semiconductor laser comprising a laser part of a continuous multi-quantum well (MQW) layer;

a waveguide mesa comprising a waveguide part of the continuous MQW layer;

a segmented travelling wave electrode (TWE) comprising a plurality of electrode segments disposed on the waveguide mesa; and a microstrip transmission line disposed on an insulating spacer layer and in electrical communication with the segmented TWE structure via conducting bridges, wherein:

the waveguide mesa comprises alternating active sections and passive sections, an electrode segment of the plurality of electrode segments is disposed on a respective one of the active sections, portions of the waveguide section the continuous MQW layer disposed in respective longitudinal portions of each of the active sections have an energy gap defining an active energy gap value, portions of the continuous MQW layer disposed in respective longitudinal portions of each of the passive sections have an energy gap defining a passive energy gap value, and each active energy gap value is less than each passive energy gap value.

10. The integrated EAM-laser device of claim 9, wherein the laser part of the continuous MQW layer defines an energy gap having a laser energy gap value and the laser energy gap value is less than the active energy gap value.

11. The integrated EAM-laser device of claim 9, wherein the continuous MQW layer is formed using a single epitaxial growth process.

12. The integrated EAM-laser device of claim 11, wherein a quantum well intermixing process and rapid thermal annealing process are performed after the single epitaxial growth process to cause the active energy gap value to be different from the passive energy gap value.

13. The integrated EAM-laser device of claim 12, wherein the quantum well intermixing process and the rapid thermal annealing process cause the laser energy gap value to be less than the active energy gap value.

14. The integrated EAM-laser device of claim 11, wherein a selective area growth (SAG) method is used to form the continuous MQW layer using the single epitaxial growth process.

15. The integrated EAM-laser device of claim 14, wherein an SAG mask of a first width is used to form the laser part of the continuous MQW layer, SAG masks of a second width are used to form the portions of the continuous MQW layer disposed in the active sections of the waveguide mesa, and SAG masks of a third width are used to form the portions of the continuous MQW layer disposed in the passive sections of the waveguide mesa, wherein the first width is larger than the second width and the second width is larger than the third width.

16. The integrated EAM-laser device of claim 15, wherein the third width is zero.

17. The integrated EAM-laser device of claim 9, wherein each of the plurality of electrode segments has a length in a propagation direction defined by the waveguide mesa that is less than 65 microns.

18. The integrated EAM-laser device of claim 9, wherein the EAM device has an electrode filling factor of less than 0.5.

19. The integrated EAM-laser device of claim 9, wherein the EAM device has a mesa waist of less than 2.3 um.

20. A method of fabricating an electro-absorption modulator (EAM) device, the method comprising:

forming a continuous multi-quantum well (MQW) layer of a waveguide mesa; and forming a plurality of electrode segments on the waveguide mesa, wherein:

the waveguide mesa comprises alternating active sections and passive sections, portions of the waveguide mesa having an electrode segment of the plurality of electrode segments disposed thereon are active sections of the waveguide mesa, portions of the continuous MQW layer disposed in respective longitudinal portions of each of the active sections have an energy gap defining an active energy gap value, portions of the continuous MQW layer disposed in respective longitudinal portions of each of the passive sections have an energy gap defining a passive energy gap value, and each active energy gap value is less than each passive energy gap value; and forming a microstrip transmission line on an insulating spacer layer and in electrical communication with each of the plurality of electrode segments via conducting bridges.

\* \* \* \* \*